United States Patent
Yu (12)

(10) Patent No.: US 6,348,387 B1
(45) Date of Patent: Feb. 19, 2002

(54) FIELD EFFECT TRANSISTOR WITH ELECTRICALLY INDUCED DRAIN AND SOURCE EXTENSIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 86 days.

(21) Appl. No.: 09/612,771

(22) Filed: Jul. 10, 2000

(51) Int. Cl.$^7$ .............................................. H01L 21/336
(52) U.S. Cl. ........................................ 438/303; 257/389
(58) Field of Search ................................. 438/303, 197, 438/267, 304, 305, 558, 564; 257/389 391, 412

(56) References Cited

U.S. PATENT DOCUMENTS

| | | | | | |
|---|---|---|---|---|---|
| 4,868,617 A | * | 9/1989 | Chiao et al. | ................ | 357/23.3 |
| 6,232,166 B1 | * | 5/2001 | Ju et al. | ...................... | 438/231 |
| 6,300,205 B1 | * | 10/2001 | Fulford et al. | .............. | 438/303 |

\* cited by examiner

*Primary Examiner*—David Nelms
*Assistant Examiner*—Quoc Hoang
(74) *Attorney, Agent, or Firm*—Monica H. Choi

(57) ABSTRACT

For fabricating a field effect transistor within an active device area of a semiconductor substrate, a gate dielectric is formed on the active device area of the semiconductor substrate, and a gate structure is formed on the gate dielectric with the gate structure being comprised of a first conductive material. A drain spacer comprised of a second conductive material is formed on a first sidewall of the gate structure, and a first liner dielectric is formed between the drain spacer and the first sidewall of the gate structure and between the drain spacer and the semiconductor substrate. A source spacer comprised of the second conductive material is formed on a second sidewall of the gate structure, and a second liner dielectric is formed between the source spacer and the second sidewall of the gate structure and between the source spacer and the semiconductor substrate. Application of at least a drain threshold voltage on the drain spacer with respect to the semiconductor substrate induces charge accumulation in the semiconductor substrate under the first liner dielectric to form a drain extension of the field effect transistor. Similarly, application of at least a source threshold voltage on the source spacer with respect to the semiconductor substrate induces charge accumulation in the semiconductor substrate under the second liner dielectric to form a source extension of the field effect transistor. In this manner, the drain and source extensions of the field effect transistor are electrically induced to have a depth that is shallow regardless of thermal processes used for fabrication of the integrated circuit having the field effect transistor.

20 Claims, 4 Drawing Sheets

FIELD EFFECT TRANSISTOR WITH ELECTRICALLY INDUCED DRAIN AND SOURCE EXTENSIONS

TECHNICAL FIELD

The present invention relates generally to fabrication of field effect transistors having scaled-down dimensions, and more particularly, to fabrication of a field effect transistor with electrically induced drain and source extensions for minimizing short channel effects in the field effect transistor having scaled-down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Figure 1:
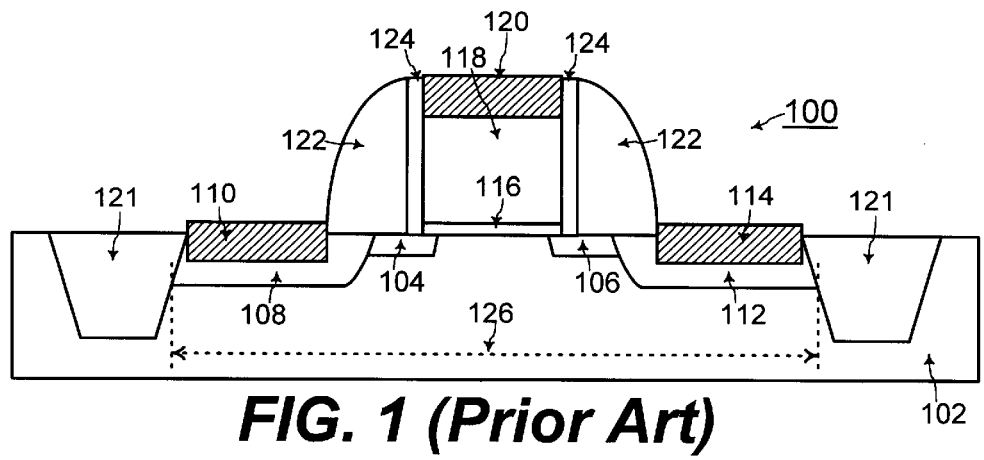

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

As the dimensions of the MOSFET 100 are further scaled down to tens of nanometers, short channel effects are more likely to disadvantageously affect the operation of the MOSFET 100, as known to one of ordinary skill in the art of integrated circuit fabrication. To prevent short channel effects as the dimensions of the MOSFET 100 are further scaled down, shallower junctions for the drain and source extensions 104 and 106 are desired. Conventionally, the drain and source extensions 104 and 106 are formed by implantation of a dopant into the semiconductor substrate 102. However, the shallow depth of the junctions for the drain and source extensions 104 and 106 may be limited when the implanted dopant forms such junctions because of thermal processes which heat up the semiconductor substrate 102. The dopant within the junctions for the drain and source extensions 104 and 106 thermally drift during such thermal processes to increase the depth of such junctions.

Thus, a mechanism is desired for fabricating junctions for the drain and source extensions that remain shallow with thermal processes during fabrication of the integrated circuit having the MOSFET.

SUMMARY OF THE INVENTION

Accordingly, in a general aspect of the present invention, conductive spacers are formed on the sidewalls of a gate structure of a MOSFET for forming electrically induced drain and source extensions. Such electrically induced drain and source extensions remain shallow even with thermal processes during fabrication of the MOSFET.

In one embodiment of the present invention, for fabricating a field effect transistor within an active device area of a semiconductor substrate, a gate dielectric is formed on the active device area of the semiconductor substrate, and a gate structure is formed on the gate dielectric with the gate structure being comprised of a first conductive material. A drain spacer comprised of a second conductive material is formed on a first sidewall of the gate structure, and a first liner dielectric is formed between the drain spacer and the first sidewall of the gate structure and between the drain spacer and the semiconductor substrate. A source spacer comprised of the second conductive material is formed on a second sidewall of the gate structure, and a second liner dielectric is formed between the source spacer and the second sidewall of the gate structure and between the source spacer and the semiconductor substrate.

Application of at least a drain threshold voltage on the drain spacer with respect to the semiconductor substrate induces charge accumulation in the semiconductor substrate under the first liner dielectric to form a drain extension of the field effect transistor. Similarly, application of at least a source threshold voltage on the source spacer with respect to the semiconductor substrate induces charge accumulation in the semiconductor substrate under the second liner dielectric to form a source extension of the field effect transistor. In addition, application of at least a gate threshold voltage on the gate structure with respect to the semiconductor substrate induces charge accumulation in the semiconductor substrate under the gate dielectric to turn on the field effect transistor.

The present invention may be used to particular advantage when the first conductive material of the gate structure is polysilicon and germanium with a germanium content in a range of from about 50% to about 80%, and when the second conductive material of the drain and source spacers is polysilicon such that the gate threshold voltage is greater than the drain and source threshold voltages. In that case, a gate silicide is formed with the first conductive material of the gate structure and with the second conductive material of the drain and source spacers such that the gate structure and the drain and source spacers are electrically connected. Application of a predetermined turn-off voltage that is less than the gate threshold voltage and greater than the drain and source threshold voltages on the gate silicide forms the drain extension and the source extension when the field effect transistor is turned off.

In this manner, the drain extension and the source extension of the field effect transistor are electrically induced and have a shallow depth of from about 5 Å (angstroms) to about 15 Å (angstroms). Because the drain extension and the source extension of the field effect transistor are electrically induced, the drain extension and the source extension are shallow regardless of thermal processes used for fabrication of the integrated circuit having the field effect transistor.

These and other features and advantages of the present invention will be better understood by considering the following detailed description of the invention which is presented with the attached drawings.

BRIEF DESCRIPTION OF THE INVENTION

FIG. 1 shows a cross-sectional view of a conventional MOSFET (Metal Oxide Semiconductor Field Effect Transistor) having conventional drain and source extension junctions formed from implantation of a dopant into a semiconductor substrate; and FIGS. 2, 3, 4, 5, 6, 7, 8, 9, 10, 11, and 12 show cross-sectional views for illustrating the steps for fabricating a MOSFET (Metal Oxide Semiconductor Field Effect Transistor) with conductive spacers formed on the sidewalls of a gate structure of the MOSFET for forming electrically induced drain and source extensions.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 2:
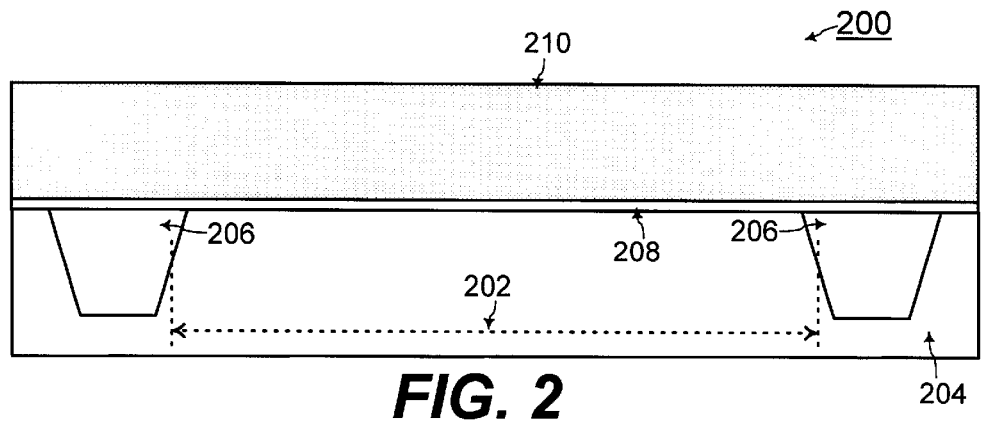

Referring to FIG. 2, a MOSFET (Metal Oxide Semiconductor Field Effect Transistor) 200 is to be fabricated within an active device area 202 of a semiconductor substrate 204 defined by shallow trench isolation structures 206. Processes for formation of shallow trench isolation structures for electrically isolating integrated circuit devices within a semiconductor substrate are known to one of ordinary skill in the art of integrated circuit fabrication.

For formation of a gate of the MOSFET 200, a gate dielectric layer 208 is deposited on the semiconductor substrate 204. The gate dielectric layer 208 may be comprised of silicon dioxide ($SiO_2$). In that case, the thickness of the gate dielectric layer 208 is in a range of from about 15 Å (angstroms) to about 25 Å (angstroms) for the MOSFET 200 having scaled down dimensions of tens of nanometers.

Alternatively, the gate dielectric layer 208 may be comprised of a dielectric material having a dielectric constant that is higher than the dielectric constant of silicon dioxide ($SiO_2$), such as metal oxides (i.e., aluminum oxide ($Al_2O_3$), titanium dioxide ($TiO_2$), or tantalum oxide ($Ta_2O_5$), for example). When the gate dielectric layer 208 is comprised of such dielectric material with high dielectric constant, the gate dielectric layer 208 has higher thickness to advantageously minimize charge carrier tunneling through the gate dielectric of the MOSFET 200, as known to one of ordinary skill in the art of integrated circuit fabrication. Processes for deposition of such dielectric material are known to one of ordinary skill in the art of integrated circuit fabrication.

Further referring to FIG. 2, a gate structure layer 210 comprised of a first conductive material is deposited on the gate dielectric layer 208. In one embodiment of the present invention, the first conductive material of the gate structure layer 210 is comprised of polysilicon and germanium with a germanium content in the polysilicon being in a range of from about 50% to about 80%. Processes, such a LPCVD (liquid phase chemical vapor deposition), for deposition of such a conductive material for the gate structure layer 210 are known to one of ordinary skill in the art of integrated circuit fabrication.

In another embodiment of the present invention, the first conductive material of the gate structure layer 210 is comprised of a mid-gap work-function metal such as tungsten. A mid-gap work-function metal has a Fermi-level at the middle of the silicon forbidden gap in the work-function diagram of such a metal, as known to one of ordinary skill in the art of integrated circuit fabrication. Processes for deposition of such a metal are known to one of ordinary skill in the art of integrated circuit fabrication.

Figure 3:
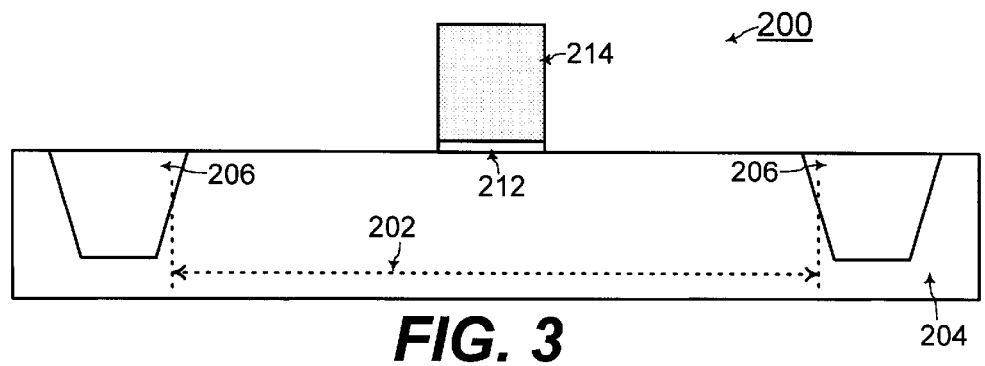

Referring to FIGS. 2 and 3, the gate structure layer 210 and the gate dielectric layer 208 are patterned and etched to form a gate dielectric 212 and a gate structure 214 of the MOSFET 200. The gate dielectric 212 is formed from patterning and etching of the gate dielectric layer 208. The gate structure 214 is formed form patterning and etching of the gate structure layer 210 and is comprised of the first conductive material of the gate structure layer 210. Processes for patterning and etching the gate structure layer 210 and the gate dielectric layer 208 to form the gate dielectric 212 and the gate structure 214 are known to one of ordinary skill in the art of integrated circuit fabrication.

Figure 4:
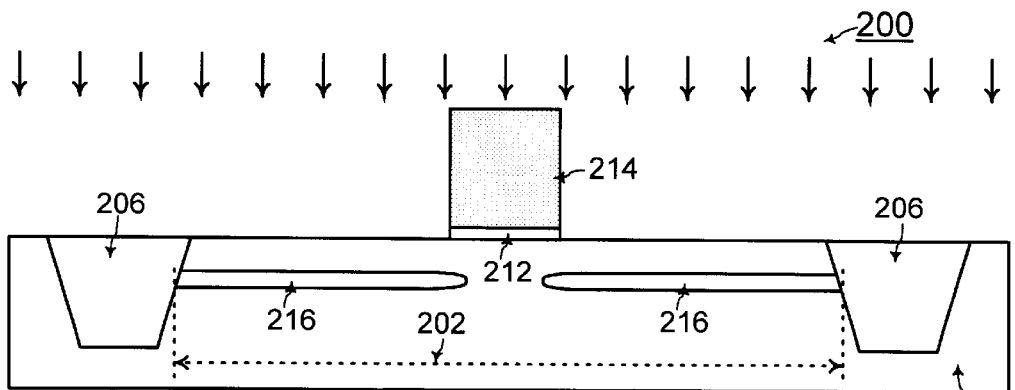

Referring to FIG. 4, a halo dopant is implanted into exposed regions of the active device area 202 of the semiconductor substrate 204 to form halo regions 216. The halo dopant is a P-type dopant such as boron when the MOSFET 200 is an NMOSFET (N-channel Metal Oxide Semiconductor Field Effect Transistor) and is an N-type dopant such as phosphorous when the MOSFET 200 is a PMOSFET (P-channel Metal Oxide Semiconductor Field Effect Transistor). The halo regions 216 formed in the active device area 202 of the semiconductor substrate 204 further reduce undesired short channel effects in the MOSFET 200, as known to one of ordinary skill in the art of integrated circuit fabrication. Processes for implantation of the halo dopant for formation of the halo regions 216 are known to one of ordinary skill in the art of integrated circuit fabrication.

Figure 5:
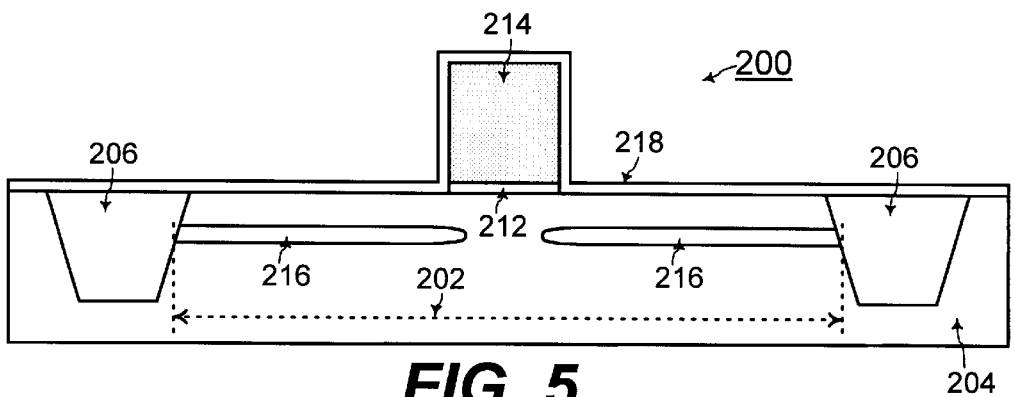

Referring to FIG. 5, a liner dielectric layer 218 is conformally deposited to cover the sidewalls of the gate dielectric 212 and of the gate structure 214 and to cover the exposed regions of the semiconductor substrate 204. In one embodiment of the present invention, the liner dielectric layer 218 is comprised of silicon dioxide ($SiO_2$) having a thickness in a range of from about 50 Å (angstroms) to about 80 Å (angstroms). Processes for conformal deposition of such a liner dielectric layer 218 are known to one of ordinary skill in the art of integrated circuit fabrication.

Figure 6:
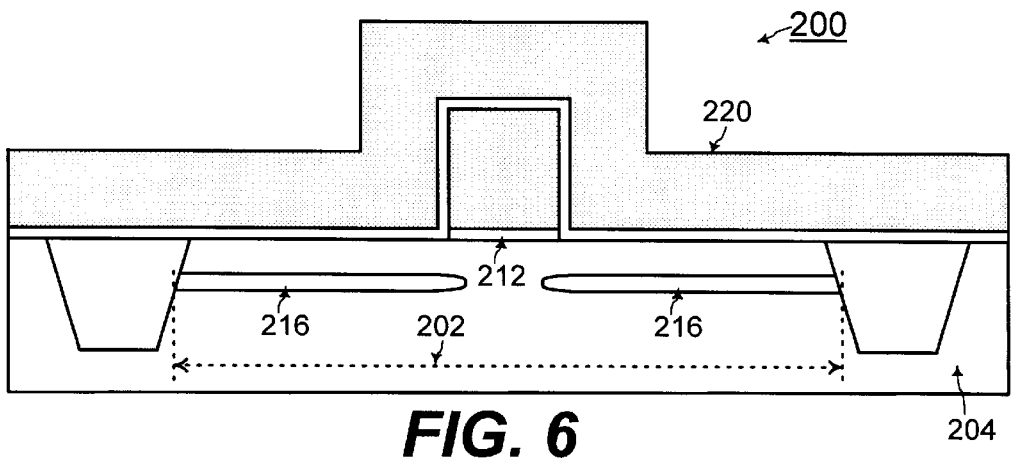

Referring to FIG. 6, a spacer layer 220 of a second conductive material is conformally deposited on the liner dielectric layer 218. In one embodiment of the present invention, when the gate structure 214 is comprised of polysilicon and germanium or a mid-gap work-function metal, the second conductive material of the spacer layer 220 is polysilicon having a thickness in a range of from about 1000 Å (angstroms) to about 1500 Å (angstroms). Processes for conformal deposition of such a spacer layer 220 are known to one of ordinary skill in the art of integrated circuit fabrication.

Figure 7:
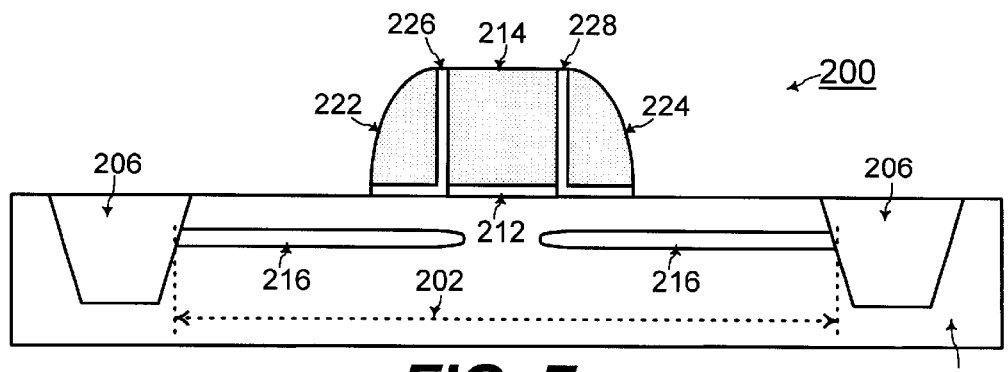

Referring to FIGS. 6 and 7, the spacer layer 220 and the liner dielectric layer 218 are anisotropically etched such that a drain spacer 222 remains at a first sidewall of the gate structure 214 and such that a source spacer 224 remains at a second sidewall of the gate structure 214. The drain spacer 222 and the source spacer 224 are formed from the anisotropic etch of the spacer layer 220 and are comprised of the second conductive material of the spacer layer 220. In one embodiment of the present invention, when the spacer layer 220 is comprised of polysilicon having a thickness in a range of from about 1000 Å (angstroms) to about 1500 Å (angstroms), the width of the drain spacer 222 and the source spacer 224 is in a range of from about 500 Å (angstroms) to about 700 Å (angstroms). Processes for anisotropically etching the spacer layer 220 to form the drain spacer 222 and the source spacer 224 are known to one of ordinary skill in the art of integrated circuit fabrication.

A first liner dielectric 226 disposed between the drain spacer 222 and the first sidewall of the gate structure 214 and between the drain spacer 222 and the semiconductor substrate 204 is formed from the anisotropic etch of the liner dielectric layer 218. Similarly, a second liner dielectric 228 disposed between the source spacer 224 and the second sidewall of the gate structure 214 and between the source spacer 224 and the semiconductor substrate 204 is formed from the anisotropic etch of the liner dielectric layer 20 218. Processes for anisotropically etching the liner dielectric layer 218 to form the first liner dielectric 226 and the second liner dielectric 228 are known to one of ordinary skill in the art of integrated circuit fabrication.

Figure 8:
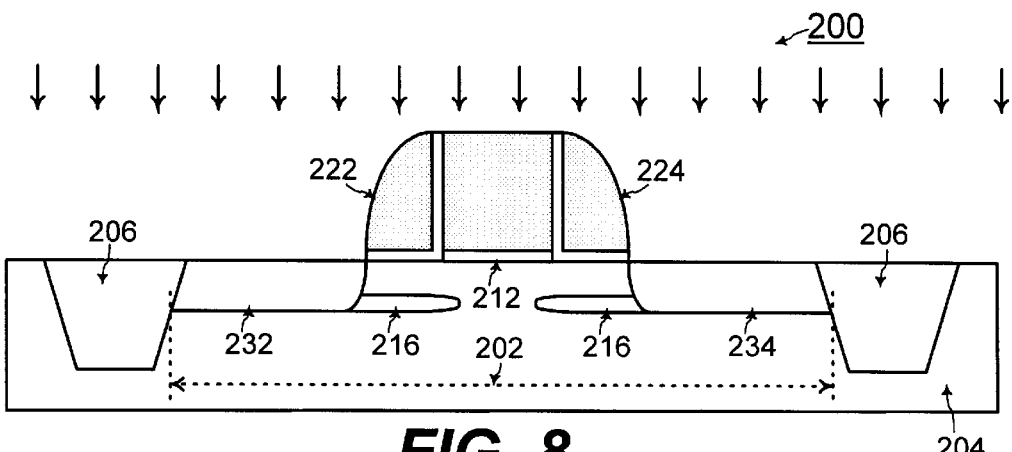

Referring to FIG. 8, a contact dopant is implanted into exposed regions of the semiconductor substrate 204 to form a drain contact junction 232 and a source contact junction 234. The contact dopant is an N-type dopant and the semiconductor substrate 204 is lightly-doped with a P-type dopant for forming the drain contact junction 232 and the source contact junction 234 of an NMOSFET (N-channel Metal Oxide Semiconductor Field Effect Transistor). Alternatively, the extension dopant is a P-type dopant and the semiconductor substrate 204 is lightly-doped with an N-type dopant for forming the drain contact junction 232 and the source contact junction 234 of a PMOSFET (P-channel Metal Oxide Semiconductor Field Effect Transistor).

Processes for implantation of the contact dopant for formation of the drain contact junction 232 and the source contact junction 234 are known to one of ordinary skill in the art of integrated circuit fabrication. A RTA (rapid thermal anneal) is performed to active the contact dopant in the drain contact junction 232 and the source contact junction 234. RTA (rapid thermal anneal) processes are known to one of ordinary skill in the art of integrated circuit fabrication.

Figure 9:
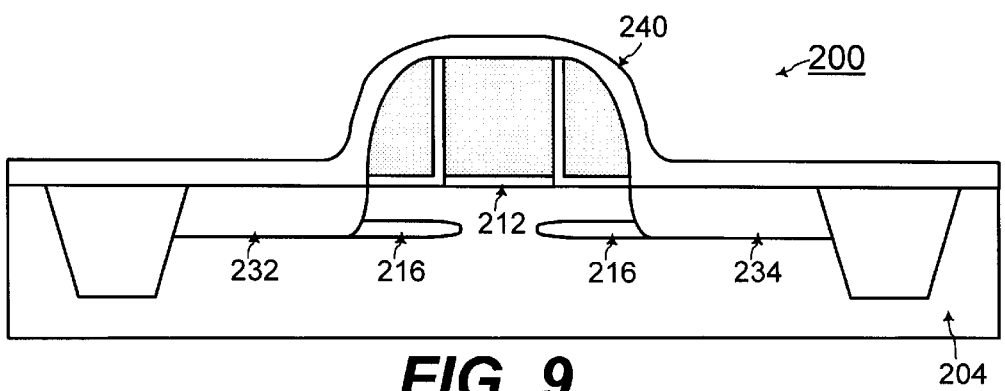

Referring to FIG. 9, an extra spacer layer 240 is conformally deposited on the semiconductor substrate 204. In one embodiment of the present invention, the extra spacer layer 240 is comprised of silicon dioxide ($SiO_2$) having a thickness in a range of from about 300 Å (angstroms) to about 500 Å (angstroms). Processes for conformal deposition of such an extra spacer layer 240 are known to one of ordinary skill in the art of integrated circuit fabrication.

Figure 10:
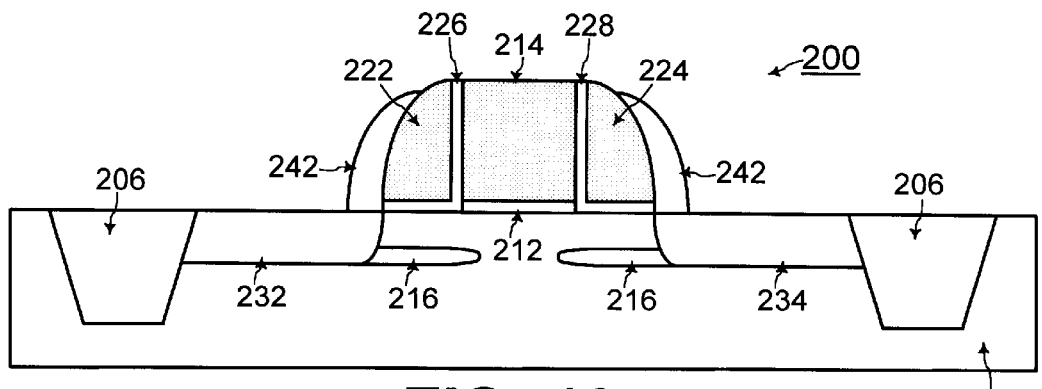

Referring to FIGS. 9 and 10, the extra spacer layer 240 is anisotropically etched to form dielectric spacers 242 on the sidewalls of the drain spacer 222 and the source spacer 224. Processes for anisotropically etching the extra spacer layer 240 to form the dielectric spacers 242 on the sidewalls of the drain spacer 222 and the source spacer 224 are known to one of ordinary skill in the art of integrated circuit fabrication.

Figure 11:
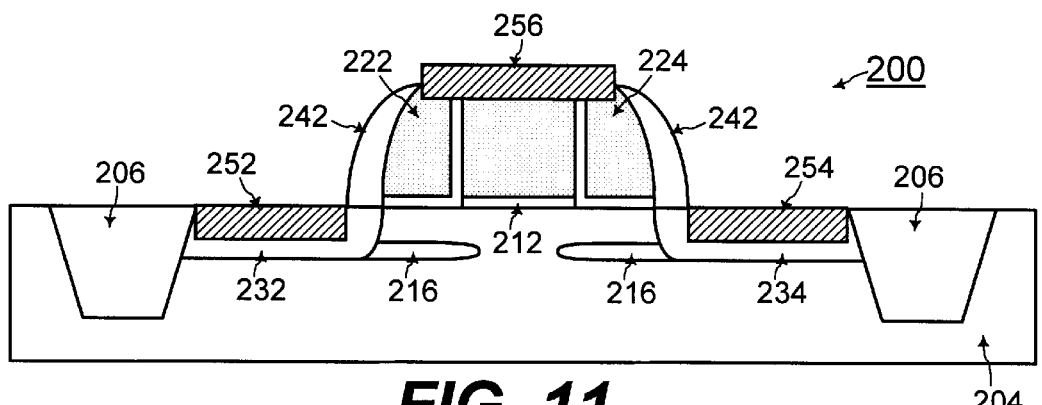

Referring to FIG. 11, a drain silicide 252 is formed with the drain contact junction 232 for providing contact to the drain of the MOSFET 200, and a source silicide 254 is formed with the source contact junction 234 for providing contact to the source of the MOSFET 200. A gate silicide 256 is formed with the gate structure 214 for providing contact to the gate of the MOSFET 200. In addition, in one embodiment of the present invention, the gate silicide 256 is also formed with the drain spacer 222 and the source spacer 224 such that the gate structure 214 is electrically connected to the drain spacer 222 and the source spacer 224. Such silicides 252, 254, and 256 may be comprised of one of cobalt silicide ($CoSi_2$) or titanium silicide ($TiSi_2$) for example, and processes for formation of such silicides are known to one of ordinary skill in the art of integrated circuit fabrication.

Figure 12:
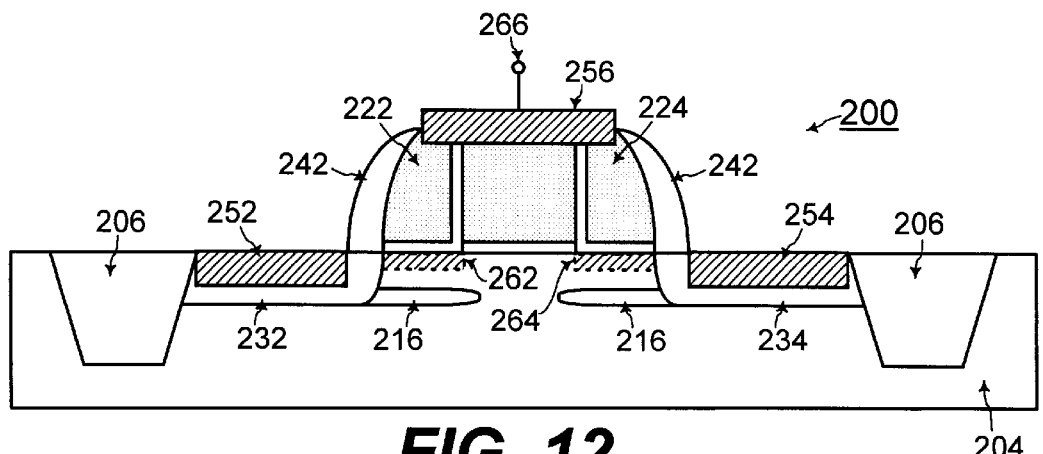

Referring to FIG. 12, for the MOSFET 200, when at least a drain threshold voltage is applied on the drain spacer 222 with respect to the semiconductor substrate 204, a drain extension 262 of the MOSFET 200 is formed from charge accumulation under the first liner dielectric 226 in the semiconductor substrate 204. The drain threshold voltage is determined by the conductive material comprising the drain spacer 222, the dielectric material comprising the first liner dielectric 226, and the thickness of the first liner dielectric 226.

Similarly, when at least a source threshold voltage is applied on the source spacer 224 with respect to the semiconductor substrate 204, a source extension 264 of the MOSFET 200 is formed from charge accumulation under the second liner dielectric 228 in the semiconductor substrate 204. The source threshold voltage is determined by the conductive material comprising the source spacer 224, the dielectric material comprising the second liner dielectric 228, and the thickness of the second liner dielectric 228. When at least a gate threshold voltage is applied on the gate structure 214 with respect to the semiconductor substrate 204, the MOSFET 200 turns on similar to the conventional MOSFET 100 of FIG. 1.

Referring to FIG. 12, in one embodiment of the present invention, when the gate structure 214 is comprised of polysilicon and germanium with a germanium content in a range of from about 50% to about 80%, and when the drain and source spacers 222 and 224 are comprised of polysilicon, the drain and source threshold voltages are smaller than the gate threshold voltage. In that case, when a predetermined voltage that is less than the gate threshold voltage and greater than the drain and source threshold voltages is applied on the gate silicide 256 with respect to the semiconductor substrate 204, the drain and source extensions 262 and 264 form while the MOSFET 200 is turned off.

In an alternative embodiment of the present invention, the gate structure 214 is comprised of a mid-gap work-function metal such as tungsten, and the drain and source spacers 222 and 224 are comprised of polysilicon. In that case, the drain and source threshold voltages are smaller than the gate threshold voltage. In a further embodiment of the present invention, the gate structure 214 is electrically connected to the drain and source spacers 222 and 224 at a gate electrode 266. In that case, when a predetermined voltage that is less than the gate threshold voltage and greater than the drain and source threshold voltages is applied on the gate electrode 266 with respect to the semiconductor substrate 204, the drain and source extensions 262 and 264 form while the MOSFET 200 is turned off.

In this manner, the drain and source extensions 262 and 264 are electrically induced in the semiconductor substrate and have a shallow depth of from about 5 Å (angstroms) to about 15 Å (angstroms). Because the drain and source extensions 262 and 266 are electrically induced, the drain and source extensions 262 and 264 are shallow regardless of thermal processes used for fabrication of the integrated circuit having the MOSFET 200. Such shallow drain and source extensions 262 and 264 are amenable for minimizing the short channel effects in the MOSFET 200 having scaled down dimensions of tens of nanometers.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor within an active device area of a semiconductor substrate, the method including the steps of:

A. forming a gate dielectric on said active device area of said semiconductor substrate;

B. forming a gate structure on said gate dielectric, said gate structure being comprised of a first conductive material;

C. forming a drain spacer comprised of a second conductive material on a first sidewall of said gate structure;

D. forming a first liner dielectric disposed between said drain spacer and said first sidewall of said gate structure and between said drain spacer and said semiconductor substrate;

E. forming a source spacer comprised of said second conductive material on a second sidewall of said gate structure;

F. forming a second liner dielectric disposed between said source spacer and said second sidewall of said gate structure and between said source spacer and said semiconductor substrate;

G. applying at least a drain threshold voltage on said drain spacer with respect to the semiconductor substrate to induce charge accumulation in said semiconductor substrate under said first liner dielectric to form a drain extension of said field effect transistor;

H. applying at least a source threshold voltage on said source spacer with respect to the semiconductor substrate to induce charge accumulation in said semiconductor substrate under said second liner dielectric to form a source extension of said field effect transistor; and I. applying at least a gate threshold voltage on said gate structure with respect to the semiconductor substrate to induce charge accumulation in said semiconductor substrate under said gate dielectric to turn on said field effect transistor.

2. The method of claim 1, wherein said first conductive material of said gate structure is polysilicon and germanium with a germanium content in a range of from about 50% to about 80%, and wherein said second conductive material of said drain and source spacers is polysilicon such that said gate threshold voltage is greater than said drain and source threshold voltages.

3. The method of claim 2, further including the step of:

forming a gate silicide with said first conductive material of said gate structure and with said second conductive material of said drain and source spacers such that said gate structure and said drain and source spacers are electrically connected.

4. The method of claim 3, further including the step of:

applying a predetermined turn-off voltage that is less than said gate threshold voltage and greater than said drain and source threshold voltages on said gate silicide with respect to the semiconductor substrate such that said drain extension and said source extension are formed when said field effect transistor is turned off.

5. The method of claim 1, wherein said first conductive material of said gate structure is a mid-gap work-function metal, and wherein said second conductive material of said drain and source spacers is polysilicon such that said gate threshold voltage is greater than said drain and source threshold voltages.

6. The method of claim 5, wherein said gate structure and said drain and source spacers are electrically connected at a gate electrode.

7. The method of claim 6, further including the step of:

applying a predetermined turn-off voltage that is less than said gate threshold voltage and greater than said drain and source threshold voltages on said gate electrode with respect to the semiconductor substrate such that said drain extension and said source extension are formed when said field effect transistor is turned off.

8. The method of claim 1, further including the step of:

implanting a halo dopant into exposed regions of said active device area of said semiconductor substrate after said step B to form halo regions under said drain and source extensions for minimizing short channel effects in said field effect transistor.

9. The method of claim 1, further including the steps of:

implanting a contact dopant into exposed regions of said active device area of said semiconductor substrate to form a drain contact junction and a source contact junction; and performing a RTA (rapid thermal anneal) to active said contact dopant in said drain contact junction and said source contact junction.

10. The method of claim 9, further including the steps of:

forming a drain silicide within said drain contact junction; and forming a source silicide within said source contact junction.

11. A method for fabricating a MOSFET (metal oxide semiconductor field effect transistor) within an active device area of a semiconductor substrate, the method including the steps of:

forming a gate dielectric on said active device area of said semiconductor substrate;

forming a gate structure on said gate dielectric, said gate structure being comprised of a first conductive material;

implanting a halo dopant into exposed regions of said active device area of said semiconductor substrate to form halo regions for minimizing short channel effects in said MOSFET;

forming a drain spacer comprised of a second conductive material on a first sidewall of said gate structure;

forming a first liner dielectric disposed between said drain spacer and said first sidewall of said gate structure and between said drain spacer and said semiconductor substrate;

forming a source spacer comprised of said second conductive material on a second sidewall of said gate structure;

forming a second liner dielectric disposed between said source spacer and said second sidewall of said gate structure and between said source spacer and said semiconductor substrate;

applying at least a drain threshold voltage on said drain spacer with respect to the semiconductor substrate to induce charge accumulation in said semiconductor substrate under said first liner dielectric to form a drain extension of said MOSFET;

applying at least a source threshold voltage on said source spacer with respect to the semiconductor substrate to induce charge accumulation in said semiconductor substrate under said second liner dielectric to form a source extension of said MOSFET;

applying at least a gate threshold voltage on said gate structure with respect to the semiconductor substrate to induce charge accumulation in said semiconductor substrate under said gate dielectric to turn on said MOSFET;

wherein said first conductive material of said gate structure is polysilicon and germanium with a germanium content in a range of from about 50% to about 80%, and wherein said second conductive material of said drain and source spacers is polysilicon such that said gate threshold voltage is greater than said drain and source threshold voltages;

forming a gate silicide with said first conductive material of said gate structure and with said second conductive material of said drain and source spacers such that said gate structure and said drain and source spacers are electrically connected;

applying a predetermined turn-off voltage that is less than said gate threshold voltage and greater than said drain and source threshold voltages on said gate silicide with respect to the semiconductor substrate such that said drain extension and said source extension are formed when said MOSFET is turned off;

implanting a contact dopant into exposed regions of said active device area of said semiconductor substrate to form a drain contact junction and a source contact junction;

performing a RTA (rapid thermal anneal) to activate said contact dopant in said drain contact junction and said source contact junction;

forming a drain silicide within said drain contact junction; and forming a source silicide within said source contact junction.

12. A field effect transistor fabricated within an active device area of a semiconductor substrate, the field effect transistor comprising:

a gate dielectric disposed on said active device area of said semiconductor substrate;

a gate structure disposed on said gate dielectric, said gate structure being comprised of a first conductive material;

a drain spacer comprised of a second conductive material disposed on a first sidewall of said gate structure;

a first liner dielectric disposed between said drain spacer and said first sidewall of said gate structure and between said drain spacer and said semiconductor substrate;

a source spacer comprised of said second conductive material disposed on a second sidewall of said gate structure;

a second liner dielectric disposed between said source spacer and said second sidewall of said gate structure and between said source spacer and said semiconductor substrate;

a drain extension of said field effect transistor that is disposed under said first liner dielectric when at least a drain threshold voltage is applied on said drain spacer with respect to the semiconductor substrate to induce charge accumulation in said semiconductor substrate under said first liner dielectric; and a source extension of said field effect transistor that is disposed under said second liner dielectric when at least a source threshold voltage is applied on said source spacer with respect to the semiconductor substrate to induce charge accumulation in said semiconductor substrate under said second liner dielectric;

wherein at least a gate threshold voltage is applied on said gate structure with respect to the semiconductor substrate to induce charge accumulation in said semiconductor substrate under said gate dielectric to turn on said field effect transistor.

13. The field effect transistor of claim 12, wherein said first conductive material of said gate structure is polysilicon and germanium with a germanium content in a range of from about 50% to about 80%, and wherein said second conductive material of said drain and source spacers is polysilicon such that said gate threshold voltage is greater than said drain and source threshold voltages.

14. The field effect transistor of claim 13, further comprising:

a gate silicide formed with said first conductive material of said gate structure and with said second conductive material of said drain and source spacers such that said gate structure and said drain and source spacers are electrically connected.

15. The field effect transistor of claim 14, wherein application of a predetermined turn-off voltage that is less than said gate threshold voltage and greater than said drain and source threshold voltages on said gate silicide with respect to the semiconductor substrate forms said drain extension and said source extension when said field effect transistor is turned off.

16. The field effect transistor of claim 12, wherein said first conductive material of said gate structure is a mid-gap work-function metal, and wherein said second conductive material of said drain and source spacers is polysilicon such that said gate threshold voltage is greater than said drain and source threshold voltages.

17. The field effect transistor of claim 16, wherein said gate structure and said drain and source spacers are electrically connected at a gate electrode.

18. The field effect transistor of claim 17, wherein application of a predetermined turn-off voltage that is less than said gate threshold voltage and greater than said drain and source threshold voltages on said gate electrode with respect to the semiconductor substrate forms said drain extension and said source extension when said field effect transistor is turned off.

19. The field effect transistor of claim 12, further comprising:

halo regions disposed under said drain extension and said source extension for minimizing short channel effects in said field effect transistor.

20. The field effect transistor of claim 12, further comprising:

a drain contact junction formed to be coupled to said drain extension in said semiconductor substrate;

a source contact junction formed to be coupled to said source extension in said semiconductor substrate;

a drain silicide formed within said drain contact junction; and a source silicide formed within said source contact junction.

\* \* \* \* \*